(12) United States Patent
Huang et al.

(10) Patent No.: US 12,213,355 B2
(45) Date of Patent: Jan. 28, 2025

(54) DISPLAY PANEL AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Yao Huang, Beijing (CN); Yudiao Cheng, Beijing (CN); Cong Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 522 days.

(21) Appl. No.: 17/620,371

(22) PCT Filed: Jan. 6, 2021

(86) PCT No.: PCT/CN2021/070439
§ 371 (c)(1),
(2) Date: Dec. 17, 2021

(87) PCT Pub. No.: WO2022/147679
PCT Pub. Date: Jul. 14, 2022

(65) Prior Publication Data
US 2023/0157097 A1 May 18, 2023

(51) Int. Cl.
*H10K 59/13* (2023.01)
*G09G 3/3233* (2016.01)
(Continued)

(52) U.S. Cl.
CPC ......... *H10K 59/131* (2023.02); *G09G 3/3233* (2013.01); *H10K 59/1213* (2023.02); *H10K 59/1216* (2023.02); *H10K 59/65* (2023.02)

(58) Field of Classification Search
CPC ............. H10K 59/131; H10K 59/1213; H10K 59/1216; H10K 59/65; H10K 59/121; G09G 3/3233; G09G 3/3275; G09G 3/3241
See application file for complete search history.

(56) References Cited

U.S. PATENT DOCUMENTS

| | | | |
|---|---|---|---|
| 2021/0012706 A1* | 1/2021 | Yang | G09G 3/32 |
| 2021/0027717 A1* | 1/2021 | Kim | H01L 27/124 |

(Continued)

FOREIGN PATENT DOCUMENTS

| | | |
|---|---|---|
| CN | 109686762 A | 4/2019 |
| CN | 110767097 A | 2/2020 |

(Continued)

OTHER PUBLICATIONS

Written Opinion for International Patent Application No. PCT/CN2021/070439 mailed Oct. 11, 2021.

*Primary Examiner* — S M Sohel Imtiaz
(74) *Attorney, Agent, or Firm* — Perilla Knox & Hildebrandt LLP; Kenneth A. Knox

(57) ABSTRACT

A display panel is described that includes a light-transmitting area, a main display area, a first transition display area, and a first wiring area. The display panel further includes: a plurality of first light-emitting units, a plurality of first pixel driving circuits, a plurality of first signal lines, a plurality of second signal lines, and a plurality of third signal lines. The plurality of first light-emitting units are located in the light-transmitting area; the plurality of first pixel driving circuits are located in the first transition display area; the plurality of first signal lines extend in the second direction and are located in the first transition display area for providing a potential signal to the first pixel driving circuit.

23 Claims, 10 Drawing Sheets

(51) Int. Cl.
    *H10K 59/121* (2023.01)
    *H10K 59/131* (2023.01)
    *H10K 59/65* (2023.01)

(56) References Cited

U.S. PATENT DOCUMENTS

| | | | |
|---|---|---|---|
| 2021/0083031 A1* | 3/2021 | Fang | H10K 59/131 |
| 2021/0225292 A1* | 7/2021 | Park | H10K 59/12 |
| 2022/0069047 A1* | 3/2022 | Yang | H10K 59/88 |

FOREIGN PATENT DOCUMENTS

| | | |
|---|---|---|
| CN | 210182387 U | 3/2020 |
| CN | 111048005 A | 4/2020 |
| CN | 111211150 A | 5/2020 |
| CN | 111261684 A | 6/2020 |
| CN | 111326560 A | 6/2020 |
| CN | 111370441 A | 7/2020 |
| CN | 111402743 A | 7/2020 |
| CN | 111785761 A | 10/2020 |
| CN | 111834425 A | 10/2020 |
| CN | 111916486 A | 11/2020 |
| CN | 112117320 A | 12/2020 |
| CN | 109686762 B | 3/2021 |
| IN | 111969027 A | 11/2020 |
| WO | 2020125004 A1 | 6/2020 |

\* cited by examiner

DISPLAY PANEL AND DISPLAY DEVICE

CROSS-REFERENCE TO RELATED APPLICATION

The present application is a national phase application under 35 U.S.C. § 371 of International Application No. PCT/CN2021/070439 filed Jan. 6, 2021, the contents of which being incorporated by reference in their entirety herein.

TECHNICAL FIELD

The present disclosure relates to a field of display technology and, in particular, to a display panel and a display device.

BACKGROUND

Under-screen camera technology includes placing a light-transmitting area on a display panel, and placing a camera directly facing the light-transmitting area to achieve a full-screen display. In the related art, in order to increase a light transmittance of the light-transmitting area, usually only light-emitting unit(s) is/are arranged in the light-transmitting area, and a pixel driving circuit for driving the light-emitting unit is arranged outside the light-transmitting area. A data line, used to provide the data signal to the pixel driving circuit, needs to be connected to the pixel driving circuit by wire bypassing. However, wire bypassing often occupies an edge wiring area of the display panel, thereby increasing a width of the display panel frame.

It should be noted that the information disclosed in the background section above is only used to enhance the understanding of the background of the present disclosure, and therefore may include information that does not constitute the prior art known to those of ordinary skill in the art.

SUMMARY

According to one aspect of the present disclosure, a display panel is provided. The display panel includes a light-transmitting area, a main display area, a first transition display area, and a first wiring area, wherein the first transition display area is located on both sides of the light-transmitting area in a first direction, the first wiring area is located on a side of the first transition display area and the light-transmitting area in a second direction, the main display area is located on a side of the first wiring area away from the first transition display area and the light-transmitting area, and wherein the first direction and the second direction intersect with each other. The display panel further includes: a first light-emitting unit, a first pixel driving circuit, a first signal line, a second signal line, and a third signal line. The first light-emitting unit is located in the light-transmitting area; the first pixel driving circuit is located in the first transition display area for providing a driving current to the first light-emitting unit; the first signal line extends in the second direction, and at least a part of the first signal line is located in the first transition display area for providing a potential signal to the first pixel driving circuit; the second signal line extends in the second direction, and at least a part of the second signal line is located in the main display area for providing a potential signal to the pixel driving circuit that is located in the main display area and located in the same sub-pixel column as the first light-emitting unit; the third signal line extends in the first direction, at least a part of the third signal line is located in the first wiring area, and the third signal line is connected to the first signal line and the second signal line through via holes, respectively.

In an exemplary embodiment of the present disclosure, the display panel further includes a second transition display area adjacently arranged on a side of the first wiring area in the second direction. The display panel further includes: a second light-emitting unit and a second pixel driving circuit. The second light-emitting unit is located in the first wiring area; and the second pixel driving circuit is located in the second transition display area for providing a driving current to the second light-emitting unit.

In an exemplary embodiment of the present disclosure, the second transition display area is located between the first wiring area and the first transition display area as well as the light-transmitting area, or the second transition display area is located between the first wiring area and the main display area.

In an exemplary embodiment of the present disclosure, the second light-emitting unit and the second pixel driving circuit connected thereto are located in the same sub-pixel column.

In an exemplary embodiment of the present disclosure, the second pixel driving circuit and the second light-emitting unit are provided in plural, and each of the second pixel driving circuits is spaced apart from a corresponding second light-emitting unit connected thereto by the same number of sub-pixel rows in the second direction.

In an exemplary embodiment of the present disclosure, the display panel further includes a first sub-pixel located in the second transition display area, and the first sub-pixel includes: a third light-emitting unit, and a third pixel driving circuit for providing a driving current to the third light-emitting unit.

In an exemplary embodiment of the present disclosure, the display panel further includes a second sub-pixel located in the first transition display area, and the second sub-pixel includes: a fourth light-emitting unit, and a fourth pixel driving circuit for providing a driving current to the fourth light-emitting unit; wherein the fourth pixel driving circuit and the first pixel driving circuit are located in different columns.

In an exemplary embodiment of the present disclosure, the first light-emitting unit and the first pixel driving circuit are provided in plural, the first pixel driving circuit and the first light-emitting unit connected thereto are located in a same row, and each of the first pixel driving circuits is spaced apart from the first light-emitting unit connected thereto by the same amount of sub-pixel columns in the first direction.

In an exemplary embodiment of the present disclosure, the display panel further includes: a base substrate, a first conductive layer, a second conductive layer, and a third conductive layer. The first conductive layer is disposed on a side of the base substrate. The second conductive layer is provided on a side of the first conductive layer facing away from the base substrate. The third conductive layer is provided on a side of the second conductive layer facing away from the base substrate. At least a part of the third conductive layer is used to form the first signal line and the second signal line.

In an exemplary embodiment of the present disclosure, the first signal line, the second signal line, and the third signal line are provided in plural, each of the third signal lines is connected between a corresponding first signal line and a corresponding second signal line, a plurality of third signal lines include a plurality of first sub-signal lines and a plurality of second sub-signal lines; at least a part of the first conductive layer is used to form the first sub-signal lines; at least a part of the second conductive layer is used to form the second sub-signal lines; and wherein orthographic projections of the first sub-signal lines on the base substrate and orthographic projections of the second sub-signal lines on the base substrate are alternately distributed in the second direction.

In an exemplary embodiment of the present disclosure, the first signal line, the second signal line, and the third signal line are provided in plural, each of the third signal lines is connected between a corresponding first signal line and a corresponding second signal line; the third signal line is formed by at least a part of the first conductive layer; wherein orthographic projections of the third signal lines on the base substrate are sequentially distributed at intervals in the second direction.

In an exemplary embodiment of the present disclosure, the first signal line, the second signal line, and the third signal line are provided in plural, each of the third signal lines is connected between a corresponding first signal line and a corresponding second signal line; the third signal line is formed by at least a part of the second conductive layer; wherein orthographic projections of the third signal lines on the base substrate are sequentially distributed at intervals in the second direction.

In an exemplary embodiment of the present disclosure, the first pixel driving circuit includes a driving transistor, and a capacitor connected to a gate of the driving transistor; wherein a part of the first conductive layer is used to form the gate of the driving transistor, and a part of the second conductive layer is used to form an electrode of the capacitor; wherein the first signal line is used to provide a data signal to the gate of the driving transistor.

In an exemplary embodiment of the present disclosure, the display panel further includes a fourth conductive layer located on a side of the third conductive layer facing away from the base substrate, wherein at least a part of the fourth conductive layer is used to form an anode of the first light-emitting unit, and the fourth conductive layer further includes a first connection line for connecting the second pixel driving circuit and an anode of the second light-emitting unit.

In an exemplary embodiment of the present disclosure, the display panel further includes a fifth transparent conductive layer located between the third conductive layer and the fourth conductive layer, wherein the fifth transparent conductive layer includes a second connection line for connecting the first pixel driving circuit and the anode of the first light-emitting unit.

In an exemplary embodiment of the present disclosure, a pixel density of the main display area is greater than each of pixel densities of the first wiring area, the first transition display area, the second transition display area and the light-transmitting area.

In an exemplary embodiment of the present disclosure, the pixel densities of the first wiring area, the first transition display area, the second transition display area and the light-transmitting area are the same.

In an exemplary embodiment of the present disclosure, the first direction is a row direction, the second direction is a column direction, and the first wiring area, the first transition display area, the second transition display area and the light-transmitting area form a low pixel density area, and the display panel includes a plurality of first pixel units located in the low pixel density area; wherein in the row direction, adjacent first pixel units are separated by the same number of pixel units, and in the column direction, adjacent first pixel units are separated by the same number of pixel units.

In an exemplary embodiment of the present disclosure, in the row direction, adjacent first pixel units are separated by three pixel units, and in the column direction, adjacent first pixel units are separated by one pixel unit.

In the first direction, adjacent first pixel units are separated by three pixel units, and in the second direction, adjacent first pixel units are separated by one pixel unit.

In an exemplary embodiment of the present disclosure, the first pixel unit includes: an R light-emitting unit, a first G light-emitting unit, a B light-emitting unit, and a second G light-emitting unit, wherein the first G light-emitting unit is located in the same row as the R light-emitting unit, and is arranged adjacent to the R light-emitting unit in the first direction; the B light-emitting unit is located in the same column as the R light-emitting unit, and is arranged adjacent to the R light-emitting unit in the second direction; the second G light-emitting unit is located in the same row as the B light-emitting unit, is located in the same column as the first G light-emitting unit, is arranged adjacent to the B light-emitting unit in the first direction, and is arranged adjacent to the first G light-emitting unit in the second direction; wherein the R light-emitting unit, the first G light-emitting unit, the B light-emitting unit and the second G light-emitting unit located in the light-transmitting area form the first light-emitting unit; the R light-emitting unit, the first G light-emitting unit, the B light-emitting unit and the second G light-emitting unit located in the first wiring area form the second light-emitting unit; the R light-emitting unit, the first G light-emitting unit, the B light-emitting unit and the second G light-emitting unit located in the second transition display area form the third light-emitting unit; and the R light-emitting unit, the first G light-emitting unit, the B light-emitting unit and the second G light-emitting unit located in the first transition display area form the fourth light-emitting unit.

In an exemplary embodiment of the present disclosure, a size of the first wiring area in the second direction is equal to a size of the first pixel unit in the second direction.

In an exemplary embodiment of the present disclosure, a size of the second transition display area in the second direction is equal to a size of the first pixel unit in the second direction.

According to another aspect of the present disclosure, there is provided a display device, the display device including the above-mentioned display panel and a camera, wherein the camera directly faces the light-transmitting area of the display panel.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the present disclosure, and together with the specification are used to explain the principle of the disclosure. Understandably, the drawings in the following description are only some embodiments of the present disclosure. For those of ordinary skill in the art, other drawings can be obtained based on these drawings without creative work.

DETAILED DESCRIPTION

Figure 1:
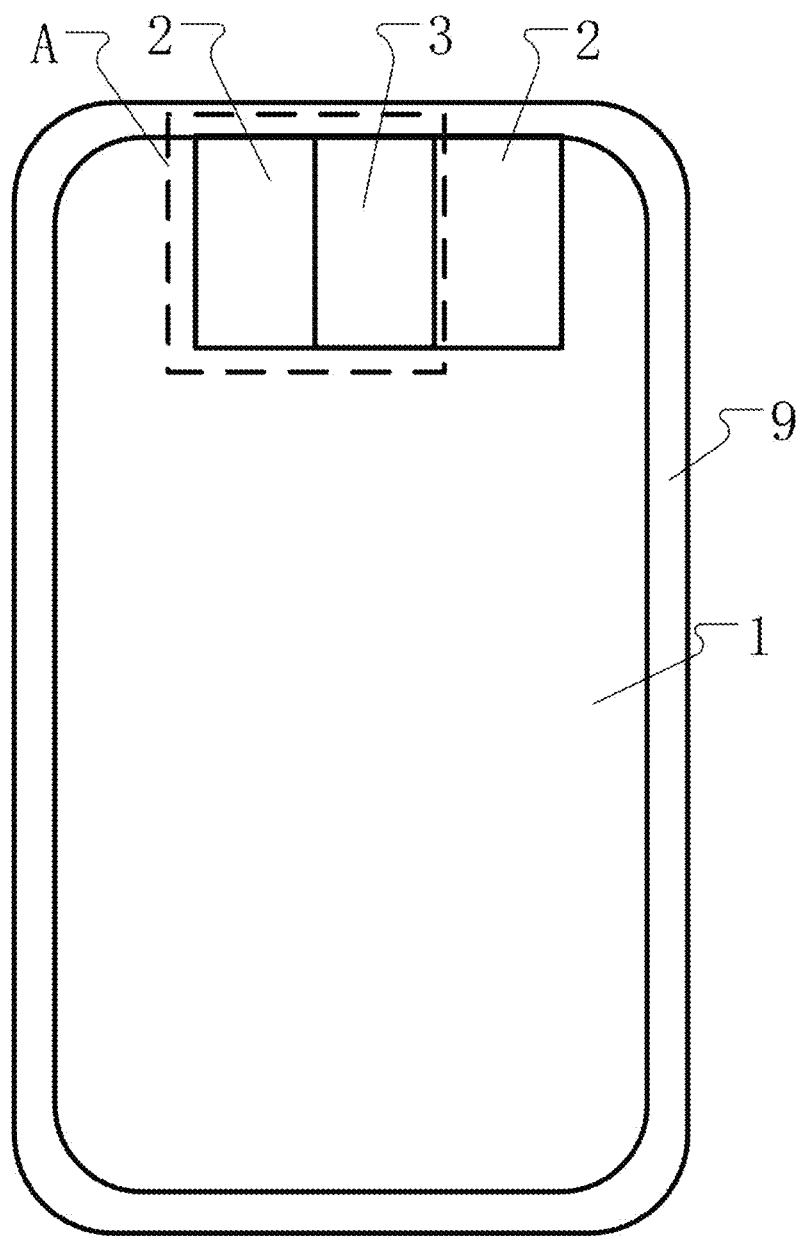
FIG. 1 is a schematic structural diagram of a display panel in the related art.

Example embodiments will now be described more fully with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments to those skilled in the art. The same reference numerals in the figures indicate the same or similar structures, and thus their detailed descriptions will be omitted.

Although relative terms such as "upper" and "lower" are used in this specification to describe the relative relationship between one component of an icon and another component, these terms are used in this specification only for convenience, for example, according to the direction of the example described in the drawings. It can be understood that if the device of the icon is turned upside down, the components described as "upper" will become the "lower" components. Other relative terms, such as "high", "low", "top", "bottom", "left", and "right" have similar meanings. When a structure is "on" another structure, it may mean that a certain structure is integrally formed on other structures, or that a certain structure is "directly" installed on other structures, or that a certain structure is "indirectly" installed on other structures through another structure.

The terms "a", "an", and "the" are used to indicate the presence of one or more elements/components/etc.; In addition to the listed elements/components/etc., there may be additional elements/components/etc.

Figure 2:
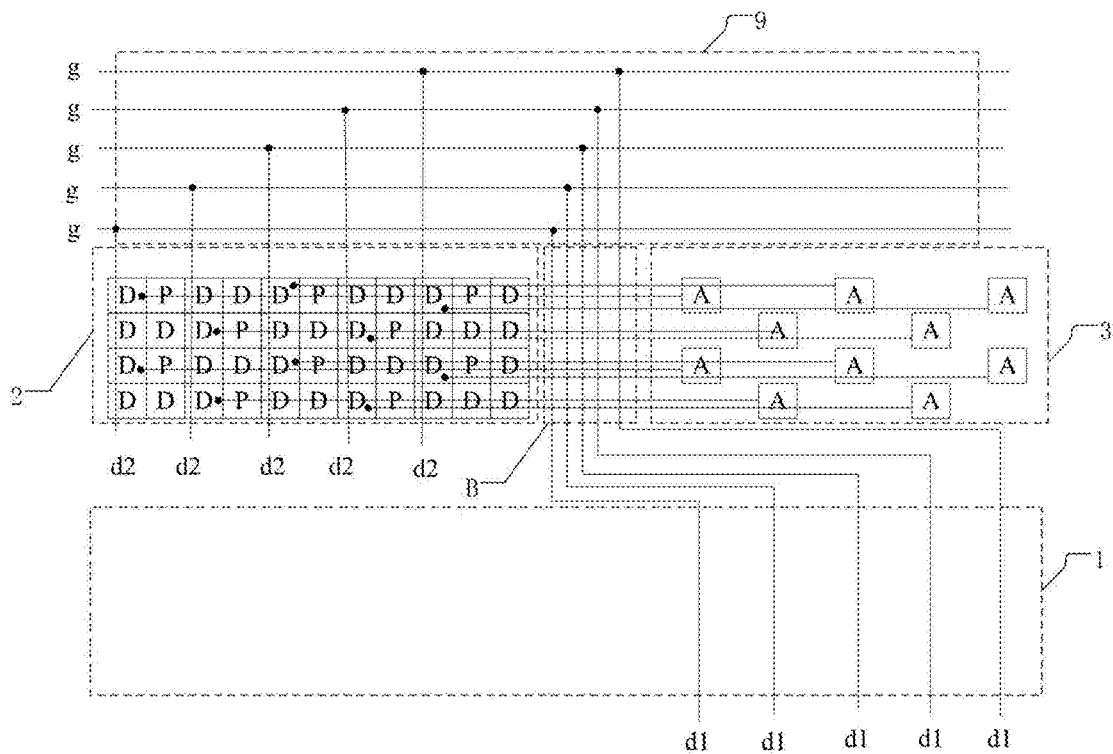
FIG. 2 is a partial enlarged view of a dotted frame A in FIG. 1.

FIG. 1 is a schematic structural diagram of a display panel in the related art, and FIG. 2 is a partial enlarged view of the dotted frame A in FIG. 1. As shown in FIGS. 1 and 2, the display panel includes a main display area 1, a light-transmitting area 3, a transition display area 2, and an edge wiring area 9. As shown in FIG. 2, only light-emitting unit(s) A is/are provided in the light-transmitting area 3 of the display panel, and a sub-pixel P with the light-emitting unit and a pixel driving circuit D without the light-emitting unit are provided in the transition display area 2 of the display panel. The display panel may provide driving current to the light-emitting unit A in the light-transmitting area 3 through the pixel driving circuit D in the transition display area 2. Since the light-transmitting area 3 is not provided with the pixel driving circuit, the light-transmitting area has a higher light transmittance. As shown in FIG. 2, in order to realize normal driving, a data line d1 located in the same sub-pixel column as the light-emitting unit A needs to be connected to the pixel driving circuit D that provides the driving current to the light-emitting unit A.

In the related art, the method for realizing the data line d1 to connect to the pixel driving circuit D in the transition display area 2 is shown in FIG. 2. A plurality of gate lines g are provided in the edge wiring area 9, and data lines d1 may pass through a collection area B, and correspondingly connect to the gate lines g through via holes one by one. At the same time, in the transition display area 2, pixel driving circuits D located in the same sub-pixel column is connected through the data line d2, and the data lines d2 may be correspondingly connected to the gate lines g through the via holes one by one. The gate g may be connected to the data line d1 and the data line d2, so that the data line d1 is connected to the pixel driving circuit D. However, on one hand, the gate line g occupies a part of the edge wiring area 9, which affects the realization of a narrow frame. On another hand, the collection area B occupies a certain space, thereby affecting an area of the light-transmitting area 3. On the other hand, the data line d1 in FIG. 2 needs to be connected to the pixel driving circuit D in the transition display area 2 by wire bypassing in the edge wiring area 9, so that the connection lines between different data lines d1 and the pixel driving circuit D have different length. Under the action of the same data signal, due to the different voltage drops of different connection lines, different pixel driving circuits D will receive different data signals, thereby affecting the uniformity of the display panel.

Figure 3:
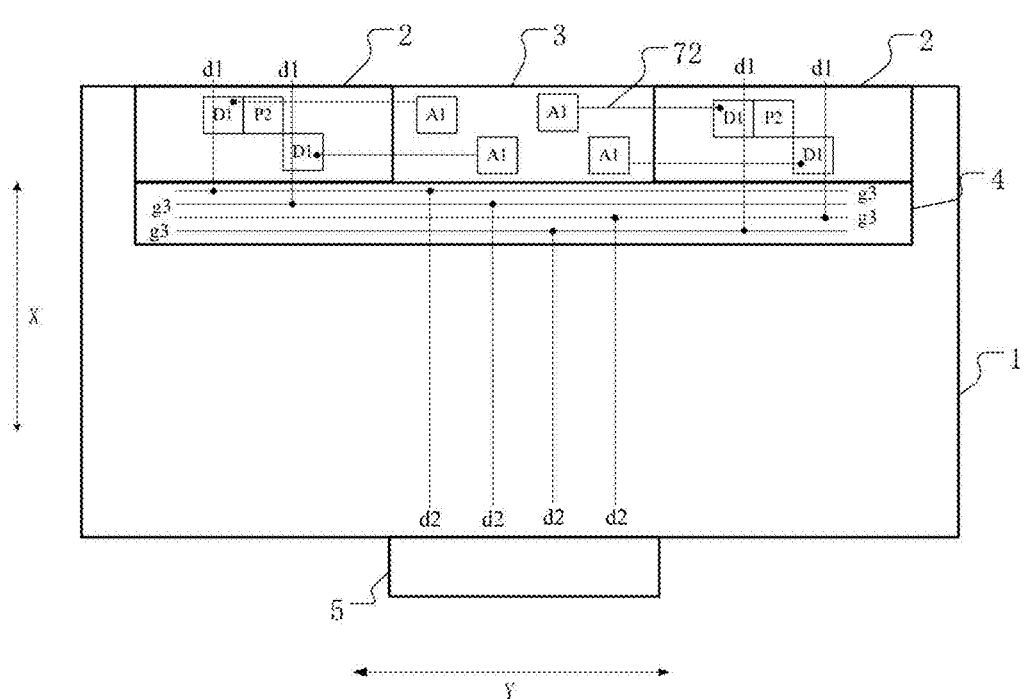
FIG. 3 is a schematic structural diagram of an exemplary embodiment of a display panel of the present disclosure.

Based on this, the exemplary embodiment provides a display panel, as shown in FIG. 3, which is a schematic structural diagram of an exemplary embodiment of a display panel of the present disclosure. The display panel may include a light-transmitting area 3, a main display area 1, a first transition display area 2, and a first wiring area 4. The first transition display area 2 may be located both sides on the light-transmitting area 3 in a first direction Y. The first wiring area 4 may be located on a side of the first transition display area 2 and the light-transmitting area 3 in a second direction X, and the first direction and the second direction intersect with each other. For example, the first direction may be a row direction, and the second direction may be a column direction. The main display area 1 may be located on a side of the first wiring area 4 away from the transparent area 3 and the first transition display area 2.

As shown in FIG. 3, the display panel may further include a first light-emitting unit A1, a first pixel driving circuit D1, a first signal line d1, a second signal line d2, and a third signal line g3. The first light-emitting unit A1 is located in the light-transmitting area 3. The first pixel driving circuit D1 is located in the first transition display area 2, and is used to provide a driving current to the first light-emitting unit A1. The first signal line d1 extends in the second direction, and at least a part of the first signal line d1 may be located in the first transition display area 2 for providing a potential signal to the first pixel driving circuit D1. The second signal line d2 extends in the second direction, and at least a part of the second signal line d2 may be located in the main display area 1, and the second signal line d2 may be used to provide a potential signal to the pixel driving circuit in the main display area. For example, the second signal line d2 may be used to provide the potential signal to the pixel driving circuit in the main display area which is in the same sub-pixel column as the first light-emitting unit A1. The third signal line g3 may extend along the first direction, and at least a part of the third signal line g3 is located in the first wiring area 4, as shown in FIG. 3. The first signal line d1 and the second signal line d2 may extend to the first wiring area 4, so that the third signal line g3 may connect to the signal line d1 and the second signal line d2 through via holes.

In this exemplary embodiment, as shown in FIG. 3, there may be a plurality of first light-emitting units A1 and first pixel driving circuits D1. The plurality of the first light-emitting units A1 may be located in different sub-pixel columns, and the plurality of the first pixel driving circuits D1 may be located in different sub-pixel columns. Correspondingly, there may be a plurality of first signal lines d1, second signal lines d2, and third signal lines d3. The first signal line d1 and the second signal line d2 may be a data line, and each of the first signal lines d1 may be connected to a first pixel driving circuit D1 in the same sub-pixel column in the first transition display area 2 for providing a data signal to the first pixel driving circuit D1 connected thereto. Each of the second signal lines d2 may be connected to a pixel driving circuit located in the same sub-pixel column in the main display area 1 for providing a data signal to the pixel driving circuit connected thereto. The first signal line d1 and the second signal line d2 may be located on the same conductive layer, and the third signal line g3 may be located on a different conductive layer from the first signal line d1 and the second signal line d2. It should be noted that the first signal line and the second signal line may also be other signal lines. For example, the first signal line and the second signal line may also be sensing lines.

In this exemplary embodiment, on the one hand, the first wiring area 4 is disposed between the main display area 1 and the first transition display area 2 as well as the light-transmitting area 3 in the display panel, and the first signal line d1 and the second signal line d2 may be connected by the third signal line g3 located in the first wiring area 4, thereby avoiding the data line from bypassing in the edge wiring area, which is beneficial to realize a display panel with a narrow frame. On another hand, the data lines in the display panel do not need to bypass, and the difference between lengths of different data lines is small, so that the uniformity of light emission of the display panel may be improved. On yet another hand, the display panel does not need to be provided with the collection area B as provided in the related art, so that a larger space may be reserved for the light-transmitting area.

In this exemplary embodiment, as shown in FIG. 3, the display panel may further include a plurality of second sub-pixels P2 which may be located in the first transition display area 2. Each second sub-pixel P2 may include a fourth pixel driving circuit and a fourth light-emitting unit, that is, the second sub-pixel P2 may emit light under the normal driving of the display panel. The second sub-pixel P2 may realize the normal display of the first transition display area 2. It should be noted that since the first transition display area 2 is provided with the second sub-pixel P2 and also the first pixel driving circuit D1, a pixel density of the first transition display area 2 (that is, a density of the pixel units formed by the second sub-pixel P2) is smaller than a pixel density of the main display area. In addition, in order to increase a light transmittance of the light-transmitting area, a pixel density of the light-transmitting area 3 (that is, a density of the pixel units formed by the first light-emitting unit) may also be less than the pixel density of the main display area. The pixel density of the light-transmitting area 3 may be equal to the pixel density of the first transition display area 2.

As shown in FIG. 3, the second sub-pixel P2 and the first pixel driving circuit D1 may be located in different columns, and this arrangement may make the first signal line d1 for connecting the first pixel driving circuit D1 and the data line for connecting the second sub-pixel P2 are located in different columns, thereby avoiding the overlap of the first signal line d1 and the data line for connecting the second sub-pixel P2. As shown in FIG. 3, the display panel may further include a source driving circuit 5 which may be located on a side of the main display area 1 away from the first wiring area 4. The source driving circuit 5 may be used to provide a data signal to the data line d2 connected thereto. A side of the light-transmitting area 3 and the first transition display area 2 in the display panel away from the first wiring area 4 may not be provided with pixel units, so that the first signal line d1 does not need to bypass back to a position right above the light-transmitting area.

Figure 4:
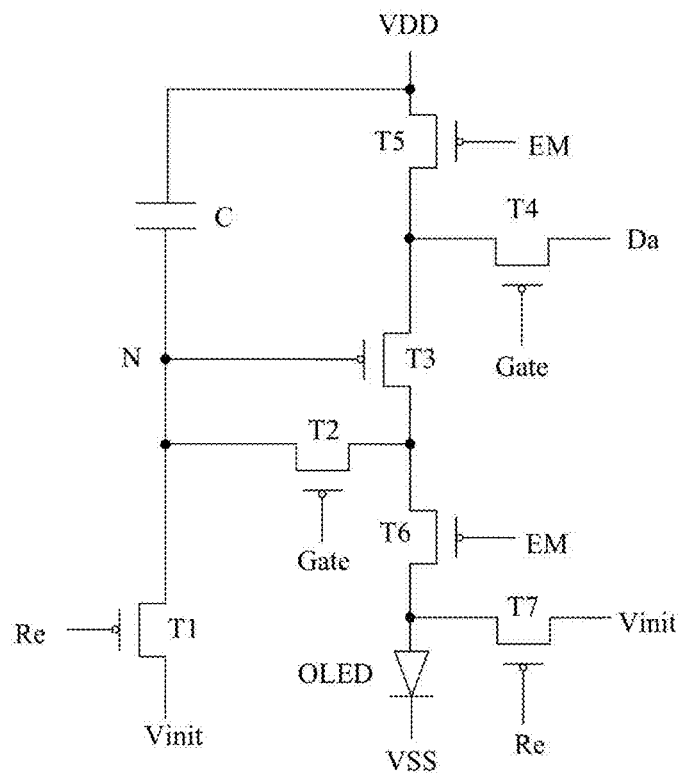
FIG. 4 is a schematic structural diagram of a first pixel driving circuit in an exemplary embodiment of the display panel of the present disclosure.

In this exemplary embodiment, as shown in FIG. 4, it is a schematic structural diagram of a first pixel driving circuit in an exemplary embodiment of the display panel of the present disclosure. The pixel driving circuit may include a first transistor T1, a second transistor T2, a driving transistor T3, a fourth transistor T4, a fifth transistor T5, a sixth transistor T6, a seventh transistor T7, and a capacitor C. A first electrode of the first transistor T1 is connected to a first electrode connecting node N, a second electrode is connected to an initialization signal terminal Vinit, and a gate is connected to a reset signal terminal Re. A first electrode of the second transistor T2 is connected to a first electrode of the driving transistor T3, a second electrode is connected to the node N, and a gate is connected to a gate driving signal terminal Gate. A gate of the driving transistor T3 is connected to node N. A first electrode of the fourth transistor T4 is connected to a data signal terminal Da, and a second electrode is connected to a second electrode of the driving transistor T3, and a gate is connected to the gate driving signal terminal Gate. A first electrode of the fifth transistor T5 is connected to a first power signal terminal VDD, a second electrode is connected to a second electrode of the driving transistor T3, and a gate is connected to an enable signal terminal EM. A first electrode of the sixth transistor T6 is connected to the first electrode of the driving transistor T3, and a gate is connected to the enable signal terminal EM. A first electrode of the seventh transistor T7 is connected to the initialization signal terminal Vinit, and a second electrode is connected to the second electrode of the sixth transistor T6. The pixel driving circuit may be connected to a light-emitting unit OLED for driving the light-emitting unit OLED to emit light, and the light-emitting unit OLED may be connected between the second electrode of the sixth transistor T6 and a second power terminal VSS. Each of the transistors T1-T7 may be a P-type transistor. Other pixel driving circuits in the display panel may have the same structure as the first pixel driving circuit.

Figure 5:
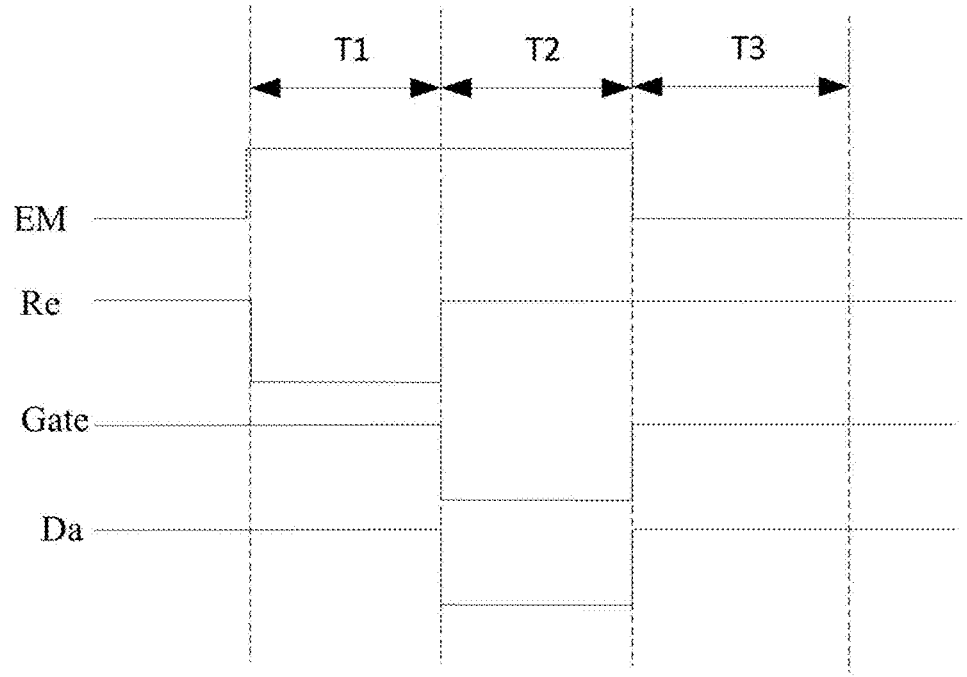
FIG. 5 is a timing diagram of each node in a driving method of the pixel driving circuit of FIG. 4.

As shown in FIG. 5, it is a timing diagram of each node in a driving method of the pixel driving circuit of FIG. 4. Gate represents a timing of the gate driving signal terminal Gate, Re represents a timing of the reset signal terminal Re, EM represents a timing of the enable signal terminal EM, and Da represents a timing of the data signal terminal Da. The driving method of the pixel driving circuit may include a reset phase t1, a compensation phase t2, and a light-emitting phase t3. In the reset phase t1: the reset signal terminal Re outputs a low-level signal, the first transistor T1 and the seventh transistor T7 are conducted, and the initialization signal terminal Vinit inputs an initialization signal to the node N and the second electrode of the sixth transistor T6. In the compensation phase t2: the gate driving signal terminal Gate outputs a low level signal, the fourth transistor T4 and the second transistor T2 are conducted, and the data signal terminal Da outputs a data signal to write a voltage Vdata+Vth to the node N, wherein the Vdata is a voltage of the data signal, and the Vth is a threshold voltage of the driving transistor T3. In the light-emitting stage t3: the enable signal terminal EM outputs a low-level signal, the sixth transistor T6 and the fifth transistor T5 are conducted, and the driving transistor T3 emits light under the action of the voltage Vdata+Vth stored in the capacitor C. According to the output current formula of the drive transistor, i.e., $I=(\mu W C_{ox}/2L)(V_{gs}-V_{th})^2$, where $\mu$ is the carrier mobility, $C_{ox}$ is the gate capacitance per unit area, W is the width of the drive transistor channel, L is the length of the drive transistor channel, Vgs is the gate-source voltage difference of the driving transistor, and Vth is the threshold voltage of the driving transistor. The output current of the driving transistor in the pixel driving circuit of the present disclosure is $I=(\mu W C_{ox}/2L)(V_{data}+V_{th}-V_{dd}-V_{th})^2$. The pixel driving circuit may avoid the influence of the threshold value of the driving transistor on its output current.

Figure 6:
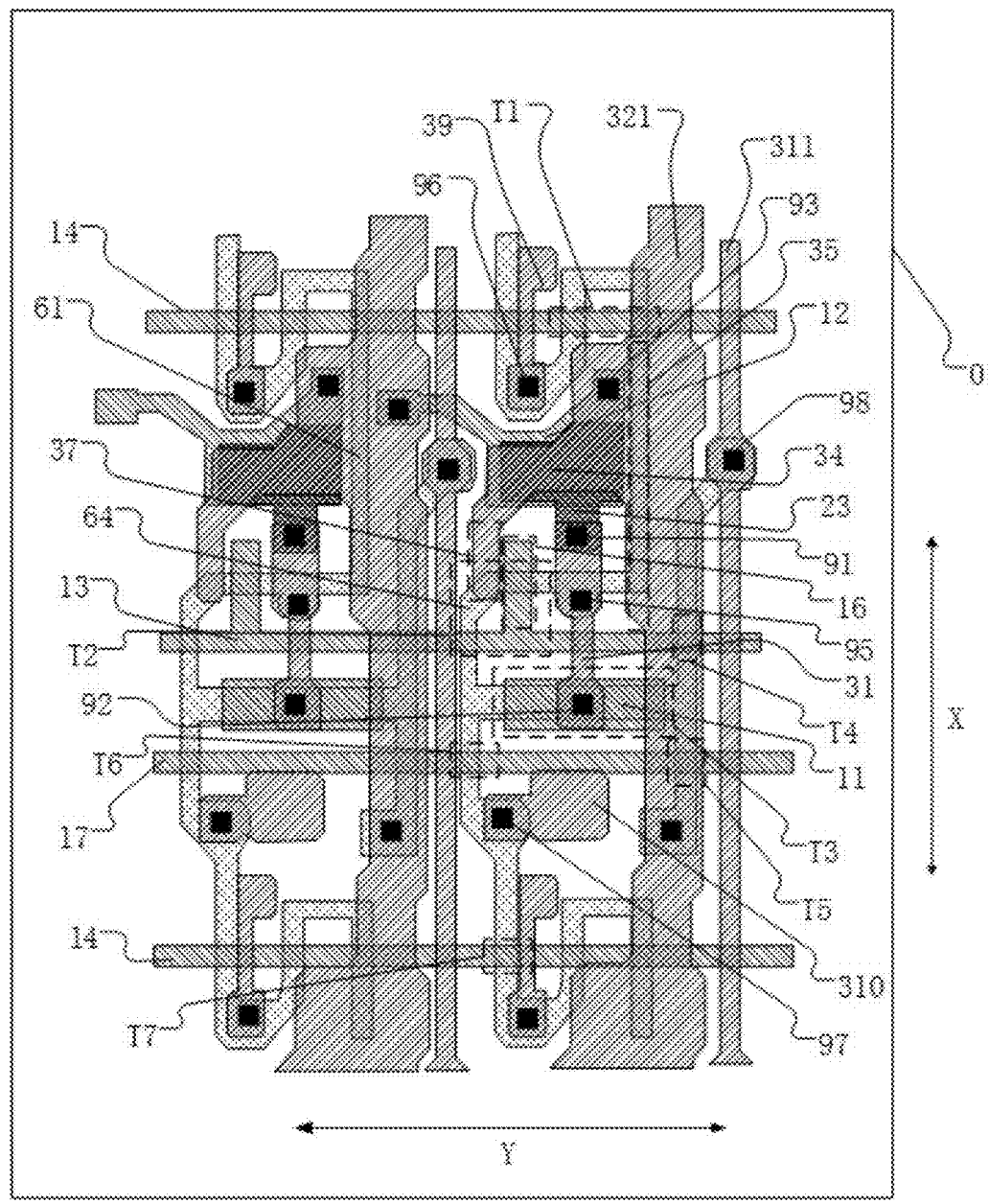
FIG. 6 is a structural layout of an exemplary embodiment of the display panel of the present disclosure.
Figure 7:
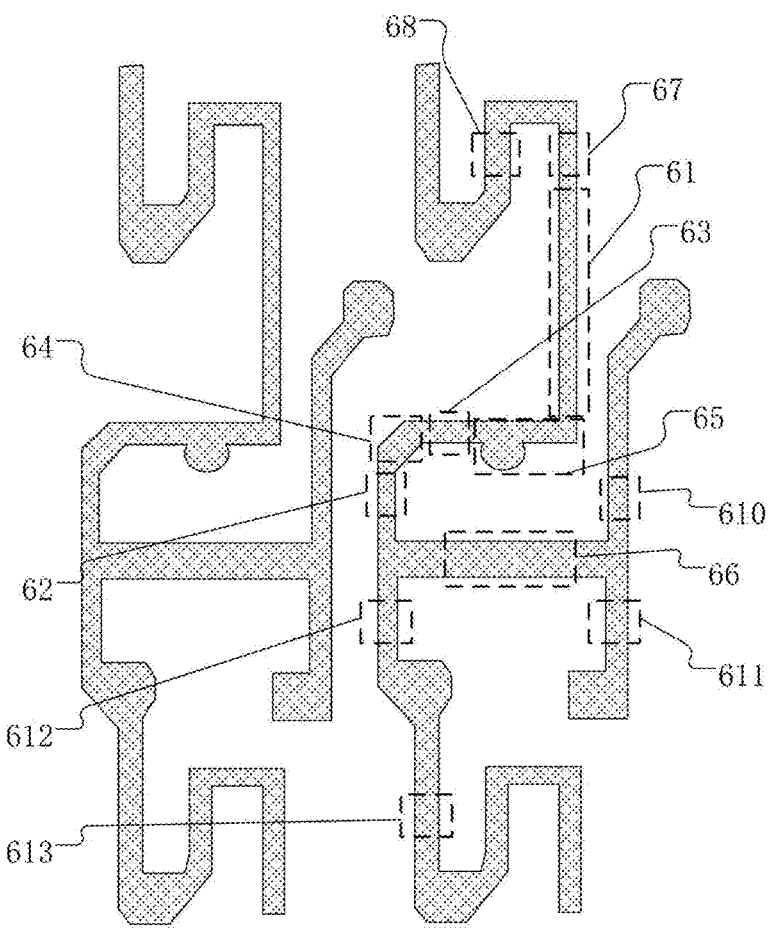
FIG. 7 is a structural layout of an active layer in FIG. 6.
Figure 8:
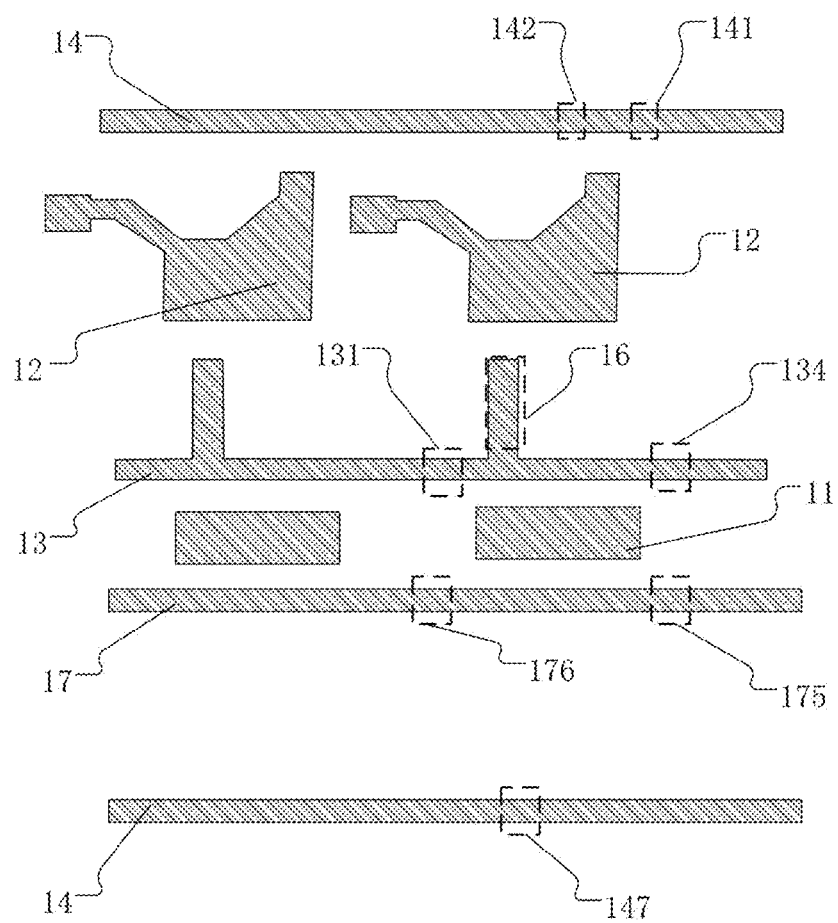
FIG. 8 is a structural layout of a first conductive layer in FIG. 6.
Figure 9:
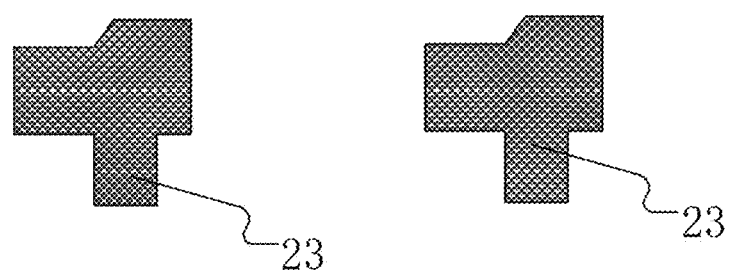
FIG. 9 is a structural layout of a second conductive layer in FIG. 6.
Figure 10:
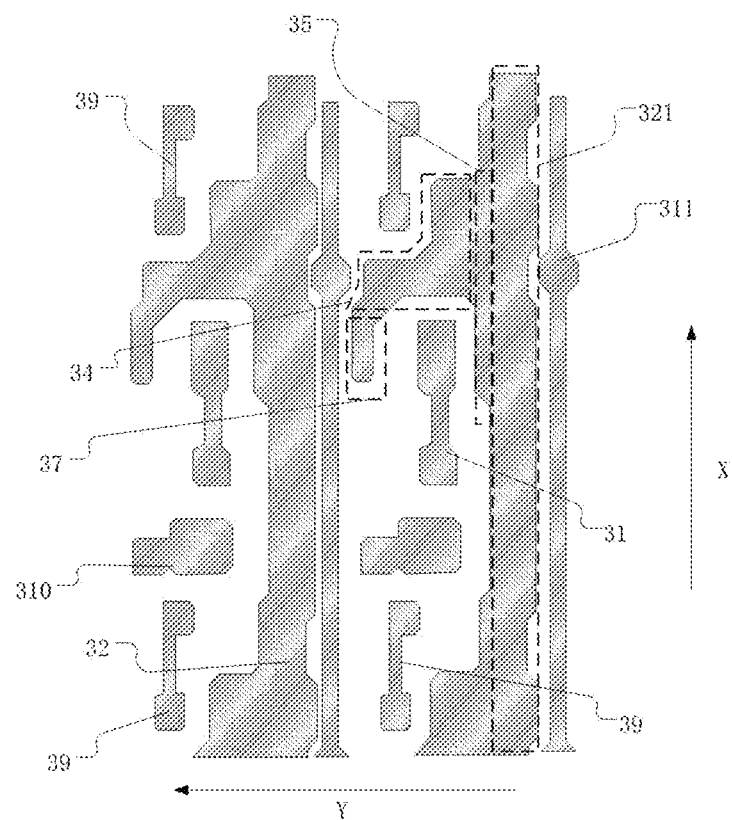
FIG. 10 is a structural layout of a third conductive layer in FIG. 6.

In this exemplary embodiment, the display panel may include a base substrate 0, an active layer, a first conductive layer, a second conductive layer, and a third conductive layer stacked in sequence. As shown in FIGS. 6, 7, 8, 9, and 10, FIG. 6 is a structural layout of an exemplary embodiment of the display panel of the present disclosure, FIG. 7 is a structural layout of an active layer in FIG. 6, FIG. 8 is a structural layout of a first conductive layer in FIG. 6, FIG. 9 is a structural layout of a second conductive layer in FIG. 6, and FIG. 10 is a structural layout of a third conductive layer in FIG. 6.

As shown in FIGS. 6 and 7, the active layer may include a first active portion 61, a second active portion 62, a third active portion 63, a fourth active portion 64, a fifth active portion 65, a sixth active portion 66, a seventh active portion 67, an eighth active portion 68, a tenth active portion 610, an eleventh active portion 611, a twelfth active portion 612, and a thirteenth active portion 613. The second active portion 62 may be used to form a first channel region of the second transistor T2, and the third active portion 63 may be used to form a second channel region of the second transistor T2. The sixth active portion 66 may be used to form a channel region of the driving transistor T3. The seventh active portion 67 may be used to form a first channel region of the first transistor T1. The eighth active portion 68 may be used to form a second channel region of the first transistor T1. The tenth active portion 610 may be used to form a channel region of the fourth transistor T4. The eleventh active portion 611 may be used to form a channel region of the fifth transistor T5. The twelfth active portion 612 may be used to form a channel region of the sixth transistor T6. The thirteenth active portion 613 may be used to form a channel region of the seventh transistor. The fourth active portion 64 may be connected between the second active portion 62 and the third active portion 63.

As shown in FIGS. 6 and 8, the first conductive layer may include a first conductive portion 11, a second conductive portion 12, a first gate line 13, a second gate line 14, a third gate line 17, and a sixth conductive portion 16. The first conductive portion 11 may also be a strip-shaped structure extending in the first direction Y. An orthographic projection of the first conductive portion 11 on the base substrate may cover an orthographic projection of the sixth active portion 66 on the base substrate to form a gate of the driving transistor T3. The second conductive portion 12 may be used to form a part of a first electrode of the capacitor C. The first gate line 13 may be used to provide the gate driving signal terminal in FIG. 5. An orthographic projection of the first gate line 13 on the base substrate may extend in the first direction Y, and the orthographic projection of the first gate line 13 on the base substrate may be located between the orthographic projection of the first conductive portion 11 on the base substrate and an orthographic projection of the second conductive portion 12 on the base substrate. A part of the conductive portion 131 of the first gate line 13 may be used to form a first gate of the second transistor T2, and a part of the conductive portion 134 of the first gate line 13 may be used to form a gate of the fourth transistor T4. The second gate line 14 may be used to provide the reset signal terminal in FIG. 1.

An orthographic projection of the second gate line 14 on the base substrate extends in the first direction Y, and the orthographic projection of the second gate line 14 on the base substrate may be located on a side of the orthographic projection of the second conductive portion 12 on the base substrate away from the orthographic projection of the first gate line 13 on the base substrate. A part of the conductive portion 141 of the second gate line 14 may be used to form a first gate of the first transistor T1, and a part of the conductive portion 142 of the second gate line 14 may be used to form a second gate of the first transistor T1. The third gate line 17 may be used to provide the enable signal terminal in FIG. 5. An orthographic projection of the third gate line 17 on the base substrate may be located on a side of the orthographic projection of the first conductive portion 11 on the base substrate away from the orthographic projection of the first gate line 13 on the base substrate. The third gate line 17 may include a conductive portion 175 and a conductive portion 176. The conductive portion 175 may be used to form a gate of the fifth transistor, and the conductive portion 176 may be used to form a gate of the sixth transistor. A gate of the seventh transistor T7 may share a conductive portion 147 in the second gate line 14 corresponding to the next row of the pixel units. An orthographic projection of the sixth conductive portion 16 on the base substrate may extend in the second direction X and be connected to the first gate line 13. A part of the sixth conductive portion 16 may be used to form a second gate of the second transistor T2.

As shown in FIGS. 6 and 9, the second conductive layer may include a third conductive portion 23, and an orthographic projection of the third conductive portion 23 on the base substrate may at least partially overlap with an orthographic projection of the second conductive portion 12 on the base substrate. The third conductive portion 23 is electrically connected to the first conductive portion 11, and the third conductive portion 23 may be used to form a second electrode of the capacitor C.

As shown in FIGS. 6 and 10, the third conductive layer may include a fourth conductive portion 34, a first connection portion 31, a power line 321, a fifth conductive portion 35, a seventh conductive portion 37, a second connection portion 39, a third connection portion 310, and a data line 311. The fifth conductive portion 35 may be connected between the fourth conductive portion 34 and the power line 321. An orthographic projection of the fourth conductive portion 34 on the base substrate may at least partially overlap with an orthographic projection of the third conductive portion 23 on the base substrate, and the fourth conductive portion 34 may be electrically connected to the second conductive portion 12 through a via hole 93. The fourth conductive portion 34 may be used to form a part of the first electrode of the capacitor C. An orthographic projection of the fifth conductive portion 35 on the base substrate and an orthographic projection of the first active portion 61 on the base substrate at least partially overlap. The seventh conductive portion 37 may be connected to the fourth conductive portion 34, and an orthographic projection of the seventh conductive portion 37 on the base substrate and an orthographic projection of the fourth active portion 64 on the base substrate at least partially overlap.

The second connection portion 39 may be connected to an active layer on a side of the eighth active portion 68 through a via hole 96 to connect to a second electrode of the first transistor T1. The third connection portion 310 may be connected to an active layer between the twelfth active portion 612 and the thirteenth active portion 613 through a via hole 97 to connect the second electrode of the sixth transistor T6 and the second electrode of the seventh transistor T7. The first electrode of the seventh transistor T7 may be connected to the second connection portion 39 in the next row of pixel units. The data line 311 may be connected to the first electrode of the fourth transistor T4 through a via hole 98. The first connection portion 31 may be electrically connected to the first conductive portion 11 through a via hole 92, and the first connection portion 31 may be electrically connected to a second sub-conductive portion 232 through a via hole 91. The fifth active portion 65 may be electrically connected to the first connection portion 31 through a via hole 95, so that the second electrode of the second transistor T2 is electrically connected to the gate of the driving transistor.

In this exemplary embodiment, the display panel may further include a transparent conductive layer located on a side of the third conductive layer facing away from the base substrate, an anode layer located on a side of the transparent conductive layer facing away from the base substrate, and an organic light-emitting layer located on a side of the anode layer facing away from the base substrate. The organic light-emitting layer may be used to form a light-emitting layer of the light-emitting unit in the display panel. It should be understood that in other exemplary embodiments, the first pixel driving circuit may also have other structures, and accordingly, the display panel may also have other corresponding layout structures.

Figure 11:
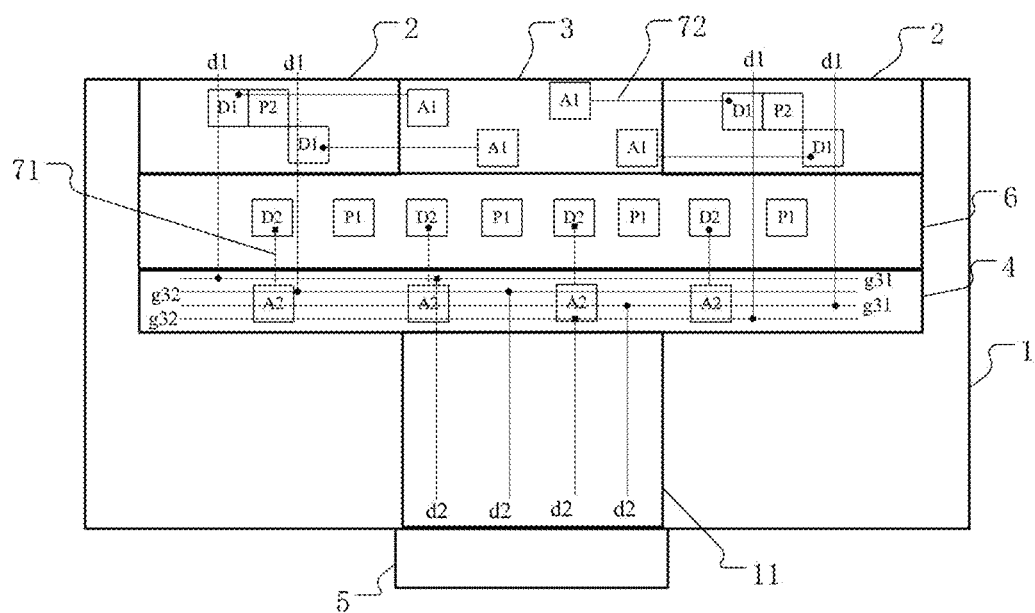
FIG. 11 is a schematic structural diagram of another exemplary embodiment of the display panel of the present disclosure.

In this exemplary embodiment, as shown in FIG. 11, it is a schematic structural diagram of another exemplary embodiment of a display panel of the present disclosure. The display panel may further include a second transition display area 6, and the second transition display area 6 may be located between the first wiring area 4 and the first transition display area 2 as well as the light-transmitting area 3. The display panel may further include a plurality of second light-emitting units A2, and a plurality of second pixel driving circuits D2. The plurality of second light-emitting units A2 may be located in the first wiring area 4. The plurality of second pixel driving circuits D2 may be located in the second transition display area 6. The second pixel driving circuit D2 may be used to provide a driving current to the second light-emitting unit A2. It should be understood that in other exemplary embodiments, the second transition display area 6 may also be located between the first wiring area 4 and the main display area 1.

In this exemplary embodiment, the third signal line g3 may be located at any one or more of the first conductive layer, the second conductive layer, and the transparent conductive layer. Since only the second light-emitting unit A2 is provided in the first wiring area 4, and the light-emitting layer of the second light-emitting unit A2 may be provided on a side of the anode layer facing away from the base substrate, that is, the second light-emitting unit A2 may be located in different structure layers from the third signal line g3, so that the second light-emitting unit A2 will not affect the normal wiring of the third signal line g3.

As shown in FIG. 11, the display panel may further include a plurality of first sub-pixels P1 which may be located in the second transition display area 6. Each first sub-pixel P1 may include a third pixel driving circuit and a third light-emitting unit, that is, the first sub-pixel P1 may emit light under the normal driving of the display panel. The first sub-pixel P1 may realize the normal display of the second transition display area 6. Pixel densities of the first wiring area 4, the second transition display area 6, the first transition display area 2, and the light-transmitting area 3 may be the same. In addition, in order to ensure the uniformity of the output characteristics of the pixel driving circuits in the second transition display area 6, the first transition display area 2, and the main display area 1, the densities of the pixel driving circuits in the second transition display area 6, the first transition display area 2 and the main display area 1 may be the same.

In this exemplary embodiment, as shown in FIGS. 3 and 11, the first pixel driving circuit D1 and the first light-emitting unit A1 connected thereto may be located in the same row, and a second connection line 72 for connecting the first pixel driving circuit D1 and the first light-emitting unit A1 may extend in the first direction. The second connection line 72 may be located in the transparent conductive layer. Each of the first pixel driving circuit D1 and the first light-emitting unit A1 connected thereto may be separated by the same number of the sub-pixel columns in the first direction. That is, each of the first pixel driving circuit D1 and the first light-emitting unit A1 connected thereto may be separated by the same distance in the first direction. This arrangement may enable the second connection lines 72 for connecting the first pixel driving circuit D1 and the first light-emitting unit A1 to have the same length, that is, the connection lines have the same voltage drop under the same voltage, so that the display panel may have better display uniformity.

In this exemplary embodiment, as shown in FIG. 11, the second light-emitting unit A2 and the second pixel driving circuit D2 connected thereto may be located in the same sub-pixel column. The first connection line 71 for connecting the second light-emitting unit A2 and the second pixel driving circuit D2 connected thereto may extend in the second direction. Each second pixel driving circuit D2 and the second light-emitting unit A2 connected thereto may be separated by the same number of sub-pixel rows in the second direction. That is, each second pixel driving circuit D2 and the second light-emitting unit A2 connected thereto may be separated by the same distance in the first direction.

This arrangement may enable different first connection lines 71 to have the same length, that is, the first connection lines 71 have the same voltage drop under the same voltage, so that the display panel may have better display uniformity.

In this exemplary embodiment, as shown in FIG. 11, the plurality of third signal lines g3 may include a plurality of first sub-signal lines g31 and a plurality of second sub-signal lines g32. Each of the first sub-signal lines g31 may be formed of a part of the first conductive layer, and each of the second sub-signal lines g32 may be formed of a part of the second conductive layer. An orthographic projection of the first signal sub-line g31 on the base substrate and an orthographic projection of the second signal sub-line g32 on the base substrate may be alternately distributed in the second direction. In the display panel, the third signal lines g3 are arranged on different conductive layers, so that the integration level of the third signal lines g3 may be increased, that is, more third signal lines g3 may be integrated in a limited size in the second direction.

Figure 12:
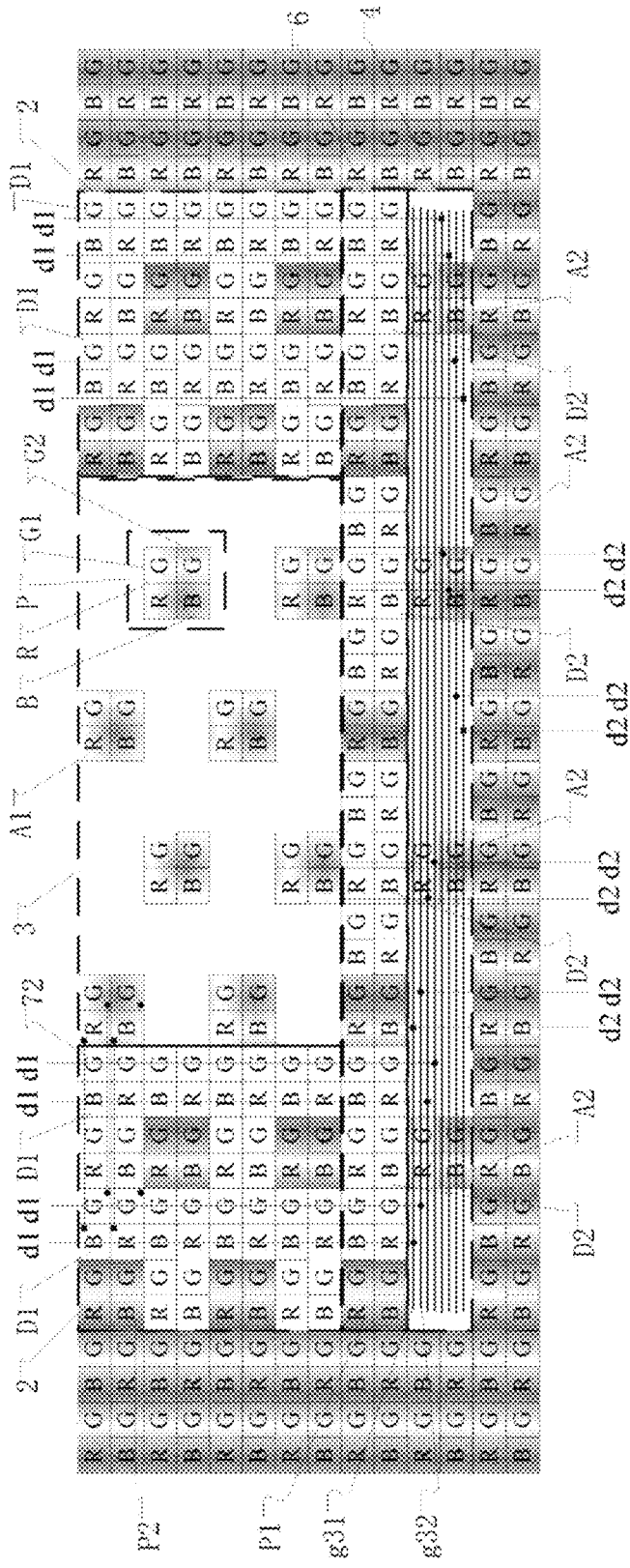
FIG. 12 is a schematic structural diagram of another exemplary embodiment of a display panel of the present disclosure.

In this exemplary embodiment, as shown in FIG. 12, it is a schematic structural diagram of another exemplary embodiment of a display panel of the present disclosure. The first wiring area 4, the first transition display area 2, the second transition display area 6, and the light-transmitting area 3 may form a low pixel density area, and the display panel may include a plurality of first pixel units P which are located in the low pixel density area, and the first pixel units P are arranged at intervals in the second direction of the row; wherein, in the first direction, adjacent first pixel units P is separated by three columns of pixel units, and in the second direction, adjacent first pixel unit P is separated by one row of pixel units. Each of the first pixel units P may be understood as a pixel point with a light-emitting unit, for example, each of a pixel point with a light-emitting unit in the light-transmitting area 3, a pixel point with a light-emitting unit and a pixel driving circuit in the first transition display area 2, a pixel point with a light-emitting unit and a pixel driving circuit in the second transition display area 6, and a pixel point with the light-emitting unit in the first wiring area may be understood as the first pixel unit. As shown in FIG. 12, a square with a filling pattern may indicate a sub-pixel point with a light-emitting unit, and a square without a filling pattern may refer to a sub-pixel point with a pixel driving circuit and without a light-emitting unit. In the first direction, adjacent first pixel units P may be separated by other number of pixel units, and in the second direction, adjacent first pixel units P may be separated by other number of pixel units. In the row direction, adjacent first pixel units may be separated by the same number of pixel units, and in the column direction, adjacent first pixel units may be separated by the same number of pixel units.

As shown in FIG. 12, the first pixel unit P may include: an R light-emitting unit R, a first G light-emitting unit G1, a B light-emitting unit B, and a second G light-emitting unit G2. The first G light-emitting unit G1 and the R light-emitting unit R are located in the same row, and are arranged adjacent to the R light-emitting unit R in the first direction. The B light-emitting unit B is located in the same column as the R light-emitting unit R, and is arranged adjacent to the R light-emitting unit R in the second direction. The second G light-emitting unit G2 is located in the same row as the B light-emitting unit B, located in the same column as the first G light-emitting unit G1, arranged adjacent to the B light-emitting unit B in the first direction, and arranged adjacent to the first G light-emitting unit G1 in the second direction.

The R light-emitting unit, the first G light-emitting unit, the B light-emitting unit, and the second G light-emitting unit located in the light-transmitting area 3 may form the above-mentioned first light-emitting unit. The R light-emitting unit, the first G light-emitting unit, the B light-emitting unit, and the second G light-emitting unit located in the first wiring area 4 may form the above-mentioned second light-emitting unit. The R light-emitting unit, the first G light-emitting unit, the B light-emitting unit and the second G light-emitting unit located in the second transition display area 6 may form the above-mentioned third light-emitting unit. The R light-emitting unit, the first G light-emitting unit, the B light-emitting unit, and the second G light-emitting unit located in the first transition display area 2 may form the above-mentioned fourth light-emitting unit.

In this exemplary embodiment, as shown in FIG. 12, a size of the first wiring area 4 in the second direction may be equal to a size of the first pixel unit in the second direction. A size of the second transition display area 6 in the second direction may also be equal to the size of the first pixel unit in the second direction. It should be understood that in other exemplary embodiments, the sizes of the first wiring area 4 and the second transition display area 6 in the second direction may also be other values, for example, the sizes of the first wiring area 4 and the second transition display area 6 in the second direction may be twice, three times, etc., the size of the first pixel unit in the second direction.

As shown in FIG. 12, the first pixel units located in the first transition display area 2 may be formed by four above-mentioned second sub-pixels P2 distributed in an array, and the first pixel units located in the second transition display area 6 may formed by four above-mentioned first sub-pixels P1 distributed in an array.

Figure 13:
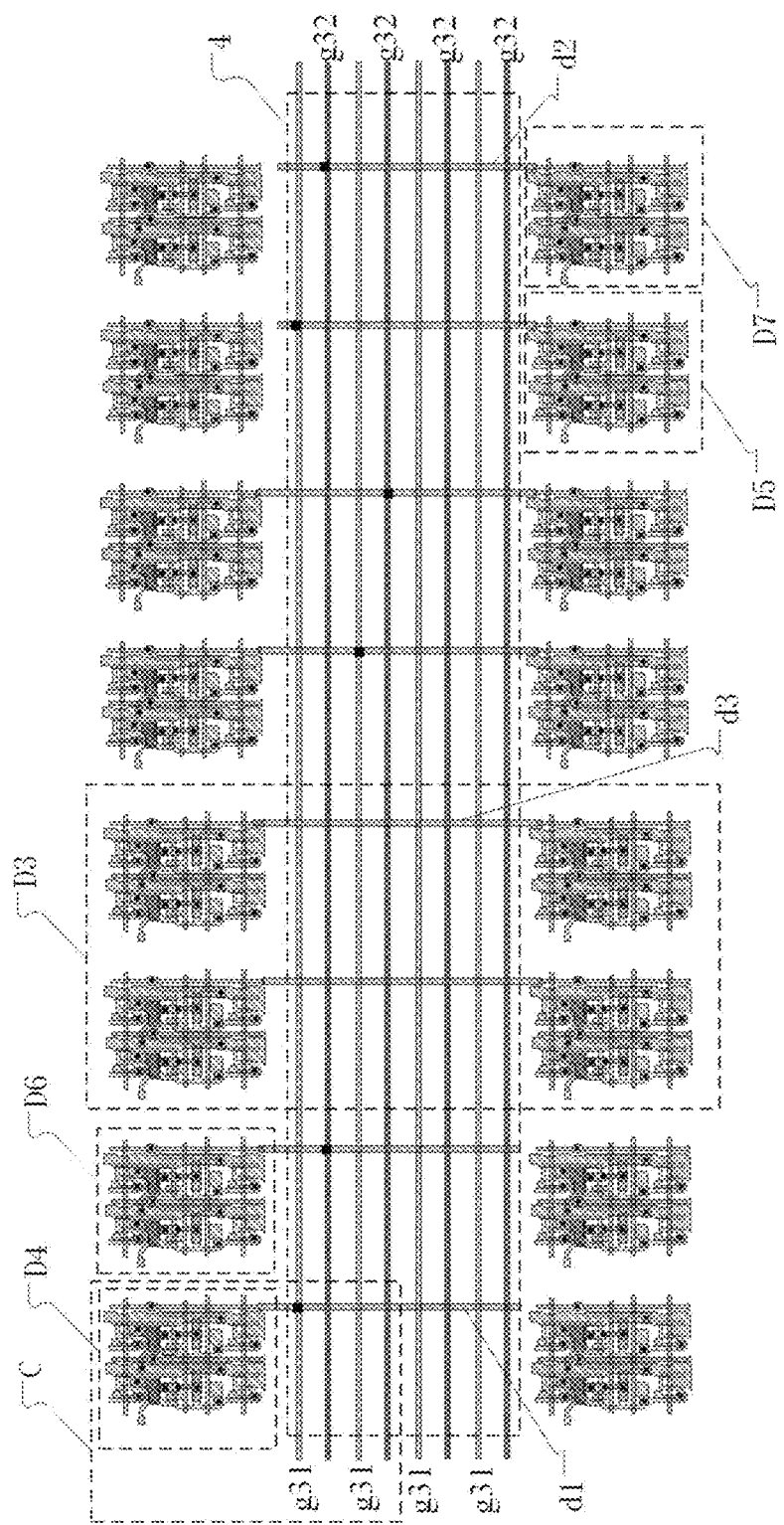
FIG. 13 is a partial enlarged view of the display panel in FIG. 12.

As shown in FIG. 13, it is a partial enlarged view of the display panel in FIG. 12. FIG. 13 shows a schematic diagram of the structure of the sub-pixel area in the 7th-14th columns and 11th-14th rows in FIG. 12. In FIG. 12, the number of rows of sub-pixels gradually increases from top to bottom, and the number of columns of sub-pixels gradually increases from left to right. As shown in FIG. 13, the pixel driving circuit D3 located in the 9th-10th columns may be connected by a data line d3 that penetrates through the first wiring area 4 in the second direction. It should be noted that each of the pixel driving circuits located in the same column as the second sub-pixel may be connected by a data line penetrating through the first wiring area 4. The pixel driving circuit D4 in the 7th column and the 10th row may be connected to the pixel driving circuit D5 in the 13th column and the 13th row through the first sub-signal line g31. The pixel driving circuit D6 in the 8th column and the 10th row may be connected to the pixel driving circuit D7 in the 14th column and the 13th row through the second sub-signal line g32.

Figure 14:
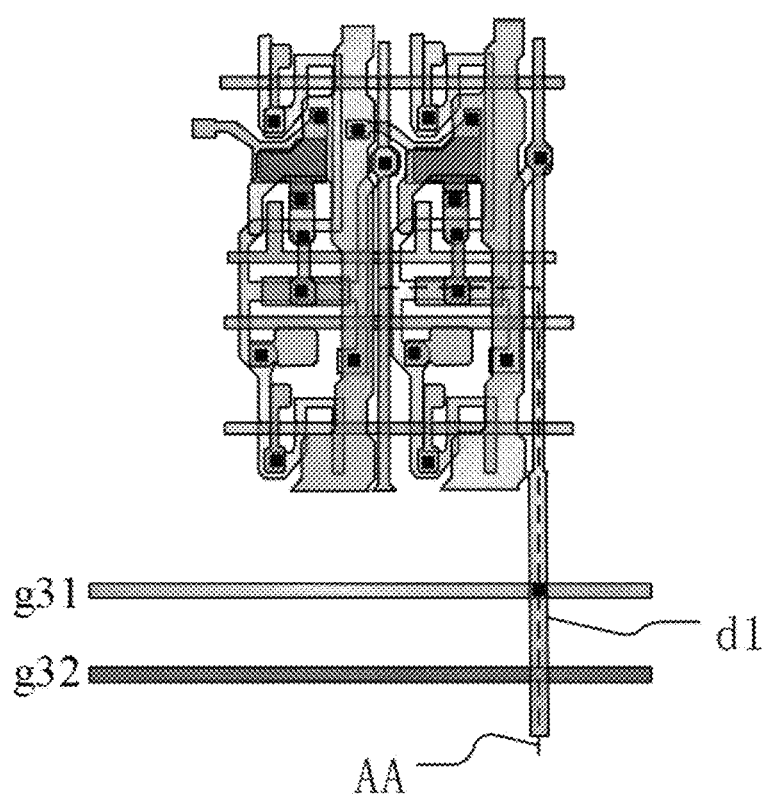
FIG. 14 is a partial enlarged view of a dotted frame C in FIG. 13.
Figure 15:
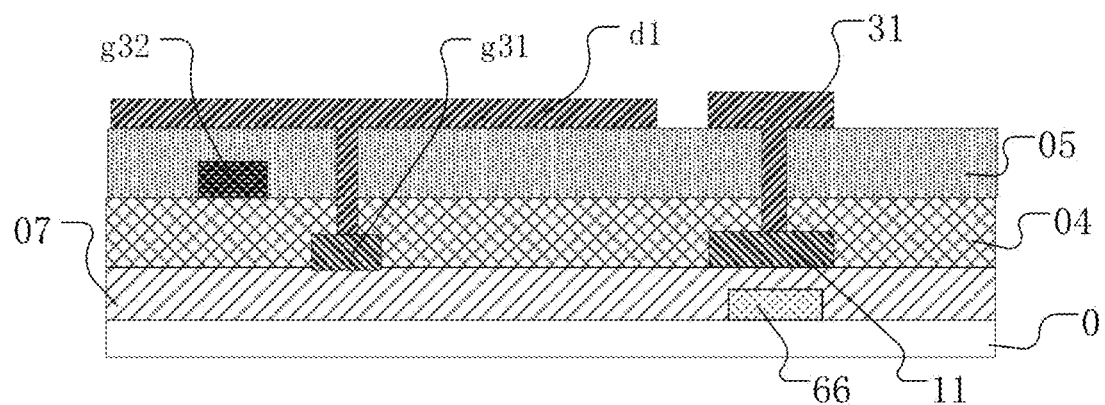
FIG. 15 is a cross-sectional view at a dotted line AA in FIG. 14.

As shown in FIGS. 14 and 15, FIG. 14 is a partial enlarged view of a dotted frame C in FIG. 13, and FIG. 15 is a cross-sectional view at a dotted line AA in FIG. 14. The display panel may also include a first gate insulating layer 04 located between the first conductive layer and the second conductive layer, and a dielectric layer 05 located between the second conductive layer and the third conductive layer, and a second gate insulating layer 07 located between the active layer and the first conductive layer. The first gate insulating layer 04 may be a silicon oxide layer, and the dielectric layer 05 may be a silicon nitride layer. Each of the first conductive layer, the second conductive layer, and the third conductive layer may be formed by at least one metal layer. For example, each of the first conductive layer, the second conductive layer, and the third conductive layer may be formed by sequentially stacking a first titanium layer, an aluminum layer, and a second titanium layer. The base substrate 0 may be formed of an insulating material. For example, the base substrate may include a first polyimide (PI) layer, a first silicon oxide (SiO) layer, an amorphous silicon layer, a second polyimide (PI) layer, and a second silicon oxide layer, which are sequentially arranged. The second gate insulating layer 07 may also be a silicon oxide layer. The first sub-signal line g31 may be located in the first conductive layer of the display panel, and the second sub-signal line g32 may be located in the second conductive layer of the display panel. An orthographic projection of the first signal sub-line g31 on the base substrate and an orthographic projection of the second signal sub-line g32 on the base substrate may be alternately distributed in the second direction.

This exemplary embodiment also provides a display device. The display device includes the above-mentioned display panel and a camera, and the camera directly faces toward the light-transmitting area of the display panel. The display device may be a display device such as a mobile phone or a tablet computer.

Those skilled in the art will easily think of other embodiments of the present disclosure after considering the specification and practicing the invention disclosed herein. This application is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are pointed out by the claims.

It should be understood that the present disclosure is not limited to the precise structure that has been described above and shown in the drawings, and various modifications and changes may be made without departing from its scope. The scope of the present disclosure is limited only by the appended claims.

What is claimed is:

1. A display panel, comprising:
   a light-transmitting area, a main display area, a first transition display area, and a first wiring area, wherein the first transition display area is located on both sides of the light-transmitting area in a first direction, the first wiring area is located on a side of the first transition display area and the light-transmitting area in a second direction, the main display area is located on a side of the first wiring area away from the first transition display area and the light-transmitting area, and the first direction and the second direction intersect with each other;
   a second transition display area adjacently arranged on a side of the first wiring area in the second direction;
   a first light-emitting unit located in the light-transmitting area;
   a second light-emitting unit located in the first wiring area;
   a first pixel driving circuit located in the first transition display area for providing a driving current to the first light-emitting unit;
   a second pixel driving circuit located in the second transition display area for providing a driving current to the second light-emitting unit;
   a first signal line extending in the second direction, wherein at least a part of the first signal line is located in the first transition display area for providing a potential signal to the first pixel driving circuit;
   a second signal line extending in the second direction, wherein at least a part of the second signal line is located in the main display area for providing a potential signal to the pixel driving circuit in the main display area; and
   a third signal line extending in the first direction, wherein at least a part of the third signal line is located in the first wiring area, and the third signal line is connected to the first signal line and the second signal line through via holes, respectively.

2. The display panel of claim 1, wherein the second signal line is used to provide a potential signal to a pixel driving circuit in the main display area that is located in a same sub-pixel column as the first light-emitting unit.

3. The display panel of claim 1, wherein the second transition display area is located between the first wiring area and the first transition display area as well as the light-transmitting area, or the second transition display area is located between the first wiring area and the main display area.

4. The display panel of claim 1, wherein the second light-emitting unit and the second pixel driving circuit connected thereto are located in a same sub-pixel column.

5. The display panel of claim 4, wherein the second pixel driving circuit and the second light-emitting unit are provided in plural, and each of the second pixel driving circuits is spaced apart from a corresponding second light-emitting unit connected thereto by a same number of sub-pixel rows in the second direction.

6. The display panel of claim 1, further comprising a first sub-pixel located in the second transition display area, and the first sub-pixel comprising: a third light-emitting unit; and a third pixel driving circuit for providing a driving current to the third light-emitting unit.

7. The display panel of claim 6, further comprising a second sub-pixel located in the first transition display area, and the second sub-pixel comprising:
   a fourth light-emitting unit; and
   a fourth pixel driving circuit for providing a driving current to the fourth light-emitting unit;
   wherein the fourth pixel driving circuit and the first pixel driving circuit are located in different columns.

8. The display panel of claim 1, wherein the first light-emitting unit and the first pixel driving circuit are provided in plural, the first pixel driving circuit and the first light-emitting unit connected thereto are located in a same row, and each of the first pixel driving circuits is spaced apart from the first light-emitting unit connected thereto by a same amount of sub-pixel columns in the first direction.

9. The display panel of claim 1, further comprising:
   a base substrate;
   a first conductive layer provided on a side of the base substrate;
   a second conductive layer provided on a side of the first conductive layer facing away from the base substrate; and
   a third conductive layer provided on a side of the second conductive layer facing away from the base substrate, wherein at least a part of the third conductive layer is used to form the first signal line and the second signal line.

10. The display panel of claim 9, wherein:
    the first signal line, the second signal line, and the third signal line are provided in plural, each of the third signal lines is connected between a corresponding first signal line and a corresponding second signal line, and a plurality of the third signal lines comprise a plurality of first sub-signal lines and a plurality of second sub-signal lines;

at least a part of the first conductive layer is used to form the first sub-signal lines;

at least a part of the second conductive layer is used to form the second sub-signal lines; and orthographic projections of the first sub-signal lines on the base substrate and orthographic projections of the second sub-signal lines on the base substrate are alternately distributed in the second direction.

11. The display panel of claim 9, wherein:
the first signal line, the second signal line, and the third signal line are provided in plural, and each of the third signal lines is connected between a corresponding first signal line and a corresponding second signal line;
the third signal line is formed by at least a part of the first conductive layer; and
orthographic projections of the third signal lines on the base substrate are sequentially distributed at intervals in the second direction.

12. The display panel of claim 9, wherein:
the first signal line, the second signal line, and the third signal line are provided in plural, and each of the third signal lines is connected between a corresponding first signal line and a corresponding second signal line;
the third signal line is formed by at least a part of the second conductive layer; and
orthographic projections of the third signal lines on the base substrate are sequentially distributed at intervals in the second direction.

13. The display panel of claim 9, wherein:
the first pixel driving circuit comprises a driving transistor, and a capacitor connected to a gate of the driving transistor;
a part of the first conductive layer is used to form the gate of the driving transistor, and a part of the second conductive layer is used to form an electrode of the capacitor; and
the first signal line is used to provide a data signal to the driving transistor.

14. The display panel of claim 13, further comprising:
a fourth conductive layer located on a side of the third conductive layer facing away from the base substrate, wherein at least a part of the fourth conductive layer is used to form an anode of the first light-emitting unit, and the fourth conductive layer further comprises:
a first connection line for connecting the second pixel driving circuit and an anode of the second light-emitting unit.

15. The display panel of claim 14, further comprising:
a fifth transparent conductive layer located between the third conductive layer and the fourth conductive layer, wherein the fifth transparent conductive layer comprises a second connection line for connecting the first pixel driving circuit and the anode of the first light-emitting unit.

16. The display panel of claim 7, wherein a pixel density of the main display area is greater than each of pixel densities of the first wiring area, the first transition display area, the second transition display area and the light-transmitting area.

17. The display panel of claim 16, wherein the pixel densities of the first wiring area, the first transition display area, the second transition display area and the light-transmitting area are the same.

18. The display panel of claim 17, wherein:
the first direction is a row direction, the second direction is a column direction, and the first wiring area, the first transition display area, the second transition display area, and the light-transmitting area form a low pixel density area;
the display panel comprises a plurality of first pixel units located in the low pixel density area; and
in the row direction, adjacent first pixel units are separated by a same number of pixel units, and, in the column direction, adjacent first pixel units are separated by a same number of pixel units.

19. The display panel of claim 18, wherein: in the row direction, adjacent first pixel units are separated by three pixel units, and in the column direction, adjacent first pixel units are separated by one pixel unit.

20. The display panel of claim 19, wherein the first pixel unit comprises:
an R light-emitting unit;
a first G light-emitting unit located in a same row as the R light-emitting unit, and arranged adjacent to the R light-emitting unit in the row direction;
a B light-emitting unit located in a same column as the R light-emitting unit, and arranged adjacent to the R light-emitting unit in the column direction;
a second G light-emitting unit located in a same row as the B light-emitting unit, located in a same column as the first G light-emitting unit, arranged adjacent to the B light-emitting unit in the row direction, and arranged adjacent to the first G light-emitting unit in the column direction;
wherein the R light-emitting unit, the first G light-emitting unit, the B light-emitting unit and the second G light-emitting unit located in the light-transmitting area form the first light-emitting unit;
the R light-emitting unit, the first G light-emitting unit, the B light-emitting unit and the second G light-emitting unit located in the first wiring area form the second light-emitting unit;
the R light-emitting unit, the first G light-emitting unit, the B light-emitting unit and the second G light-emitting unit located in the second transition display area form the third light-emitting unit; and
the R light-emitting unit, the first G light-emitting unit, the B light-emitting unit and the second G light-emitting unit located in the first transition display area form the fourth light-emitting unit.

21. The display panel of claim 20, wherein a size of the first wiring area in the second direction is equal to a size of the first pixel unit in the second direction.

22. The display panel of claim 20, wherein a size of the second transition display area in the second direction is equal to a size of the first pixel unit in the second direction.

23. A display device, comprising:
a display panel, comprising:
a light-transmitting area, a main display area, a first transition display area, and a first wiring area, wherein the first transition display area is located on both sides of the light-transmitting area in a first direction, the first wiring area is located on a side of the first transition display area and the light-transmitting area in a second direction, the main display area is located on a side of the first wiring area away from the first transition display area and the light-transmitting area, and the first direction and the second direction intersect with each other;

a second transition display area adjacently arranged on a side of the first wiring area in the second direction;

a first light-emitting unit located in the light-transmitting area;

a second light-emitting unit located in the first wiring area;

a first pixel driving circuit located in the first transition display area for providing a driving current to the first light-emitting unit;

a second pixel driving circuit located in the second transition display area for providing a driving current to the second light-emitting unit;

a first signal line extending in the second direction, wherein at least a part of the first signal line is located in the first transition display area for providing a potential signal to the first pixel driving circuit;

a second signal line extending in the second direction, wherein at least a part of the second signal line is located in the main display area for providing a potential signal to the pixel driving circuit in the main display area; and a third signal line extending in the first direction, wherein at least a part of the third signal line is located in the first wiring area, and the third signal line is connected to the first signal line and the second signal line through via holes, respectively; and a camera directly facing the light-transmitting area of the display panel.

* * * * *